US008581656B2

(12) United States Patent
Curatolo

(10) Patent No.: US 8,581,656 B2
(45) Date of Patent: Nov. 12, 2013

(54) TRANSMISSION GATE AND CONTROL CIRCUIT FOR TRANSMISSION GATE INPUTS

(75) Inventor: Giacomo Curatolo, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 175 days.

(21) Appl. No.: 13/097,517

(22) Filed: Apr. 29, 2011

(65) Prior Publication Data

US 2012/0274385 A1 Nov. 1, 2012

(51) Int. Cl.
*H03K 17/687* (2006.01)

(52) U.S. Cl.
USPC ........... 327/427; 327/434; 327/436; 327/437; 333/103

(58) Field of Classification Search
USPC .............................. 327/434, 436, 437; 333/103
See application file for complete search history.

(56) References Cited

U.S. PATENT DOCUMENTS

| | | | |
|---|---|---|---|
| 5,028,978 A | 7/1991 | Hall | |
| 5,594,381 A * | 1/1997 | Bingham | 327/534 |
| 5,767,733 A * | 6/1998 | Grugett | 327/534 |
| 6,320,408 B1 * | 11/2001 | Kwong | 326/31 |
| 6,424,203 B1 * | 7/2002 | Bayadroun | 327/536 |
| 6,462,611 B2 * | 10/2002 | Shigehara et al. | 327/534 |
| 6,628,159 B2 * | 9/2003 | Voldman | 327/534 |
| 6,828,846 B2 * | 12/2004 | Tsukazaki et al. | 327/404 |
| 6,965,263 B2 * | 11/2005 | Bringivijayaraghavan | 327/537 |
| 7,084,697 B2 * | 8/2006 | Kawagoshi | 327/536 |
| 7,095,266 B2 * | 8/2006 | Miske | 327/427 |
| 7,372,301 B2 * | 5/2008 | Fukuoka et al. | 326/81 |
| 7,728,649 B1 | 6/2010 | Webb et al. | |
| 7,834,677 B2 | 11/2010 | Yu | |
| 2009/0315118 A1 | 12/2009 | Yu | |

FOREIGN PATENT DOCUMENTS

JP       2000244298 A       9/2000

* cited by examiner

*Primary Examiner* — Kenneth B. Wells
(74) *Attorney, Agent, or Firm* — Murphy, Bilak & Homiller, PLLC

(57) ABSTRACT

A transmission gate includes first and second transmission path terminals, a series connection of first and second field effect transistors (FETs), and a control circuit. The channels of the first and second FETs are coupled in series between the first transmission path terminal and the second transmission path terminal, such that a channel contact of the first FET is coupled to the second transmission path terminal and a channel contact of the second FET is coupled to the first transmission path terminal. The control circuit is configured to provide a control voltage for a gate contact of the first FET and a control voltage for a gate contact of the second FET, such that the control voltage for the gate contact of the first FET is, in a switch-off state of the transmission gate, based on a voltage present at the first transmission path terminal, and such that the control voltage for the gate contact of the second FET is, in the switch-off state of the transmission gate, based on a voltage present at the second transmission path terminal.

19 Claims, 10 Drawing Sheets

TRANSMISSION GATE AND CONTROL CIRCUIT FOR TRANSMISSION GATE INPUTS

TECHNICAL FIELD

Embodiments of the present application relate to a transmission gate for selectively establishing a transmission path, and more particularly to a transmission gate with an extended functional range.

BACKGROUND

Transmission gates are used for a variety of applications such as for electrically connecting or disconnecting two electrical nodes.

SUMMARY

Embodiments described herein provide a transmission gate for selectively establishing a transmission path. The transmission gate includes a first transmission path terminal, a second transmission path terminal, a series connection of a first field effect transistor and a second field effect transistor, and a control circuit. A channel of the first field effect transistor and a channel of the second field effect transistor are coupled in series between the first transmission path terminal and the second transmission path terminal, such that a channel contact of the first field effect transistor is coupled to the second transmission path terminal and a channel contact of the second field effect transistor is coupled to the first transmission path terminal. The control circuit is configured to provide a control voltage for a gate contact of the first field effect transistor and a control voltage for a gate contact of the second field effect transistor, such that the control voltage for the gate contact of the first field effect transistor is, in a switch-off state of the transmission gate, based on a voltage present at the first transmission path terminal, and such that the control voltage for the gate contact of the second field effect transistor is, in the switch-off state of the transmission gate, based on a voltage present at the second transmission path terminal.

Further embodiments described herein provide a transmission gate for selectively establishing a transmission path. The transmission gate includes a first transmission path terminal, a second transmission path terminal, and a series connection of a first field effect transistor and a second field effect transistor. A channel of the first field effect transistor and a channel of the second field effect transistor are coupled in series between the first transmission path terminal and the second transmission path terminal, such that a channel contact of the first field effect transistor is coupled to the second transmission path terminal and a channel contact of the second field effect transistor is coupled to the first transmission path terminal. A bulk contact of at least one of the first field effect transistor and the second field effect transistor is connected to a node that is electrically between the channel of the first field effect transistor and the channel of the second field effect transistor.

Furthermore, embodiments described herein provide a transmission gate for selectively establishing a transmission path. The transmission gate includes a first transmission path terminal, a second transmission path terminal, a series connection of a first field effect transistor and a second field effect transistor, a third field effect transistor, a first inverter and a second inverter. A channel of the first field effect transistor and a channel of the second field effect transistor are coupled in series between the first transmission path terminal and the second transmission path terminal, such that a channel contact of the first field effect transistor is coupled to the second transmission path terminal and a channel contact of the second field effect transistor is coupled to the first transmission path terminal. A bulk contact of the first field effect transistor and a bulk contact of the second field effect transistor are connected to a node that is electrically between the channel of the first field effect transistor and the channel of the second field effect transistor. The third field effect transistor is connected in parallel to the series connection of the first field effect transistor and the second field effect transistor. A channel of the third field effect transistor is coupled between the first transmission path terminal and the second transmission path terminal. The third field effect transistor is a field effect transistor complementary to the first field effect transistor and second field effect transistor. The first inverter is coupled to the first transmission path terminal, such that the first inverter is supplied based on a voltage present at the first transmission path terminal. The second inverter is coupled to the second transmission path terminal, such that the second inverter is supplied based on a voltage present at the second transmission path terminal. The first inverter is configured to provide a control voltage for a gate contact of the first field effect transistor, and the second inverter is configured to provide a control voltage for a gate contact of the second field effect transistor.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following description, a plurality of details is set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 1:
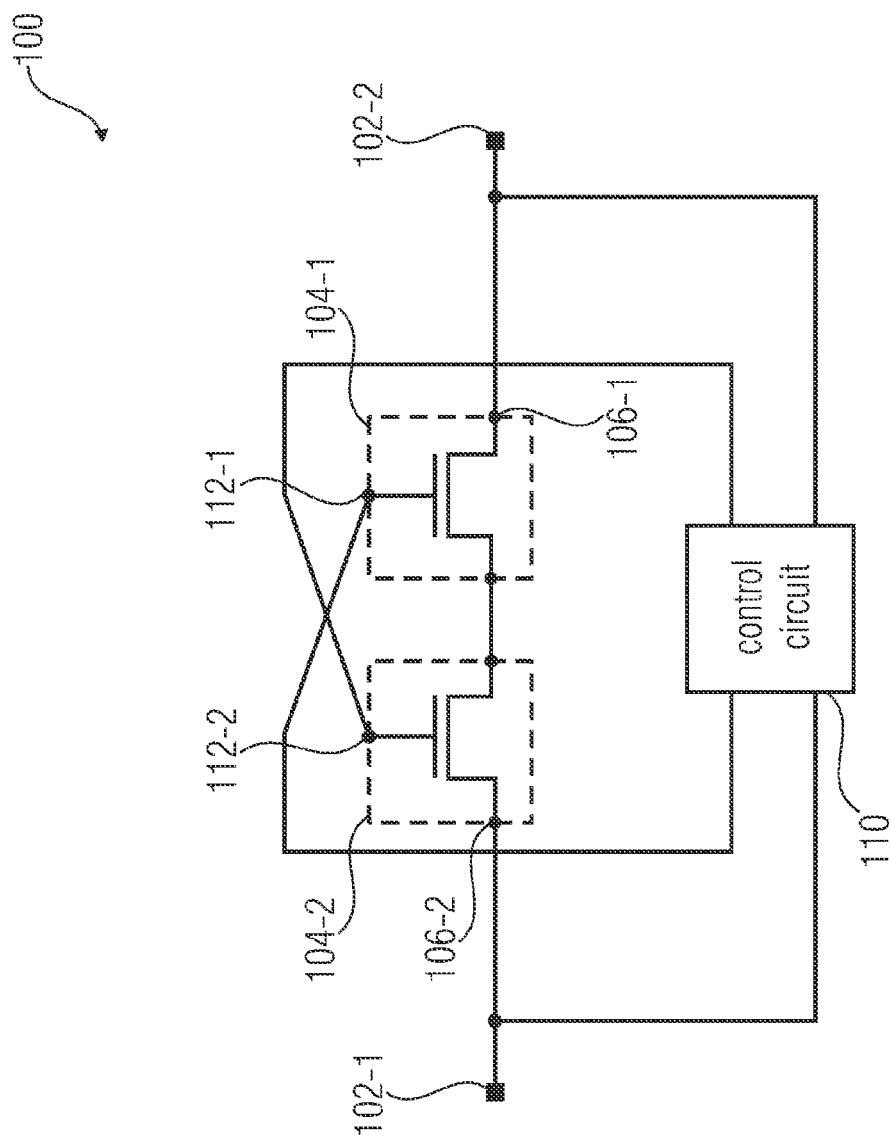
FIG. 1 shows a simplified schematic circuit of a transmission gate for selectively establishing a transmission path according to an embodiment.

FIG. 1 shows a simplified schematic circuit of a transmission gate 100 for selectively establishing a transmission path according to an embodiment. The transmission gate 100 includes a first transmission path terminal 102-1, a second transmission path terminal 102-2, a series connection of a first field effect transistor 104-1 and a second field effect transistor 104-2, and a control circuit 110. A channel of the first field effect transistor 104-1 and a channel of the second field effect transistor 104-2 are coupled in series between the first transmission path terminal 102-1 and the second transmission path terminal 102-2, such that a channel contact 106-1 of the first field effect transistor 104-1 is coupled to the second transmission path terminal 102-2 and a channel contact 106-2 of the second field effect transistor 104-2 is coupled to the first transmission path terminal 102-1. The control circuit 110 is configured to provide a control voltage for a gate contact 112-1 of the first field effect transistor 104-1 and a control voltage for a gate contact 112-2 of the second field effect transistor 104-2, such that the control voltage for the gate contact 112-1 of the first field effect transistor 104-1 is, in a switch-off state of the transmission gate 100, based on a voltage present at the first transmission path terminal 102-1, and such that the control voltage for the gate contact 112-2 of the second field effect transistor 104-2 is, in the switch-off state of the transmission gate 100, based on a voltage present at the second transmission path terminal 102-2.

In some embodiments of the circuit of FIG. 1, in the switch-off state (high impedance state) of the transmission gate 100, the gate contact 112-1 of the first field effect transistor 104-1 is supplied based on a voltage present at the first transmission path terminal 102-1 and the gate contact 112-2 of the second field effect transistor 104-2 is supplied based on a voltage present at the second transmission path terminal 102-2. Hence, in the switch-off state, at least one of the two field effect transistors 102-1 and 102-2 is switched-off (high impedance) independent of the voltage present at the first transmission path terminal 102-1 or the second transmission path terminal 102-2. In other words, in the switch-off state, the transmission gate 100 has a high impedance between the first transmission path terminal 102-1 and the second transmission path terminal 102-2 independent of the voltages present at the transmission path terminals 102-1 and 102-2.

Moreover, in some embodiments of the circuit of FIG. 1 the control circuit 100 may be configured to provide a control voltage for the gate contact 112-1 of the first field effect transistor 104-1 and for the gate contact 112-2 of the second field effect transistor 104-2, in a switch-on state of the transmission gate 100, based on a voltage present at a ground terminal of the transmission gate 100.

Furthermore, the control circuit 110 may be configured to switch the control voltage for the gate contact 112-1 of the first field effect transistor 104-1 between the voltage present at the first transmission path terminal 102-1 and the voltage present at the ground terminal, based on a voltage present at a control terminal of the transmission gate 100, and to switch the control voltage for the gate contact 112-2 of the second field effect transistor 104-2 between the voltage present at the second transmission path terminal 102-2 and the voltage present at the ground terminal, based on the voltage present at the control terminal of the transmission gate 100.

In the following, the contrast between the transmission gate 100 according to the embodiment shown in FIG. 1 and a conventional transmission gate according to a comparison example is described.

Figure 2:
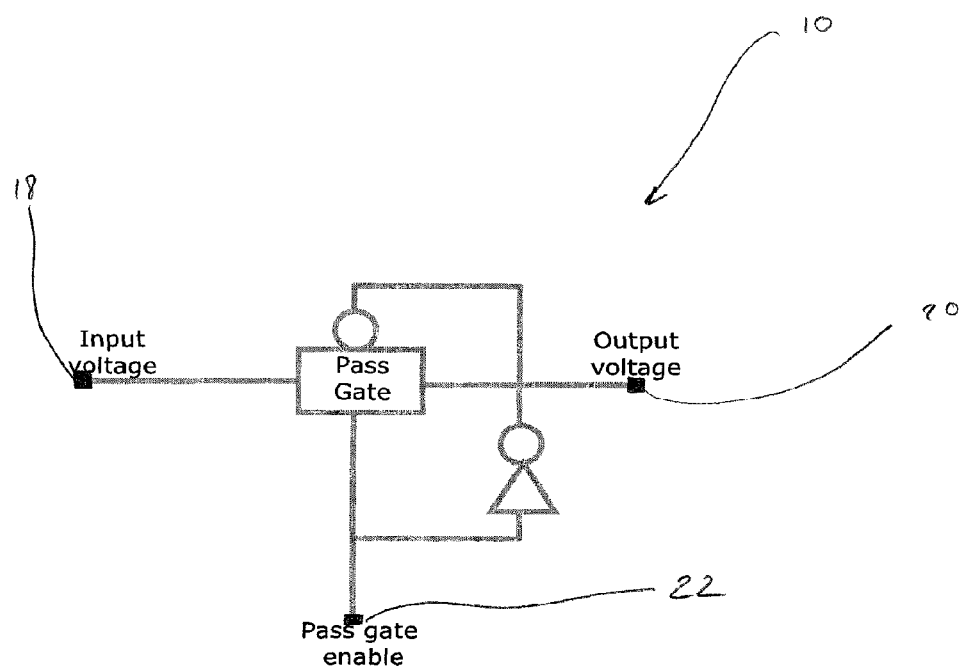
FIG. 2 shows a block diagram of a conventional transmission gate (or pass gate).

FIG. 2 shows a block diagram of a conventional transmission gate (or pass gate) 10. The transmission gate 10 might be used for electrically connecting or disconnecting an input node 18 from an output node 20.

Figure 3:
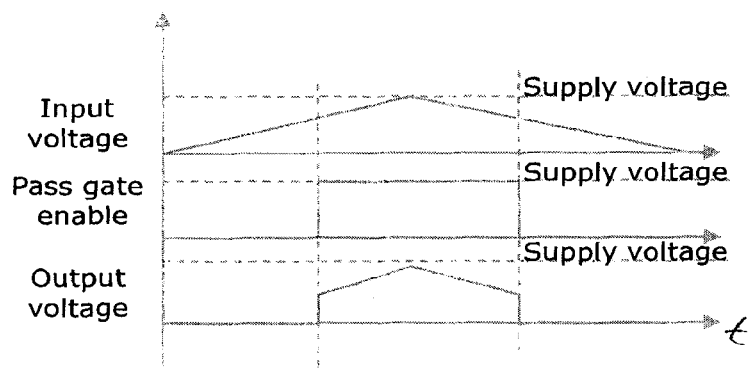
FIG. 3 shows a diagram of the voltage levels at the input node, the output node and the control terminal plotted over time.

FIG. 3 shows a diagram of the voltage levels at the input node 18, the output node 20 and the control terminal 22 plotted over time.

The transmission gate 10 can be compared to an (analog) switch that is capable of two states, a high impedance state and a low impedance state. In the low impedance state the input node 18 and the output node 20 are connected and a voltage or current can be passed from the input node 18 to the output node 20 or vice versa. In the high impedance state the input node 18 and the output node 20 are electrically disconnected.

Figure 4:
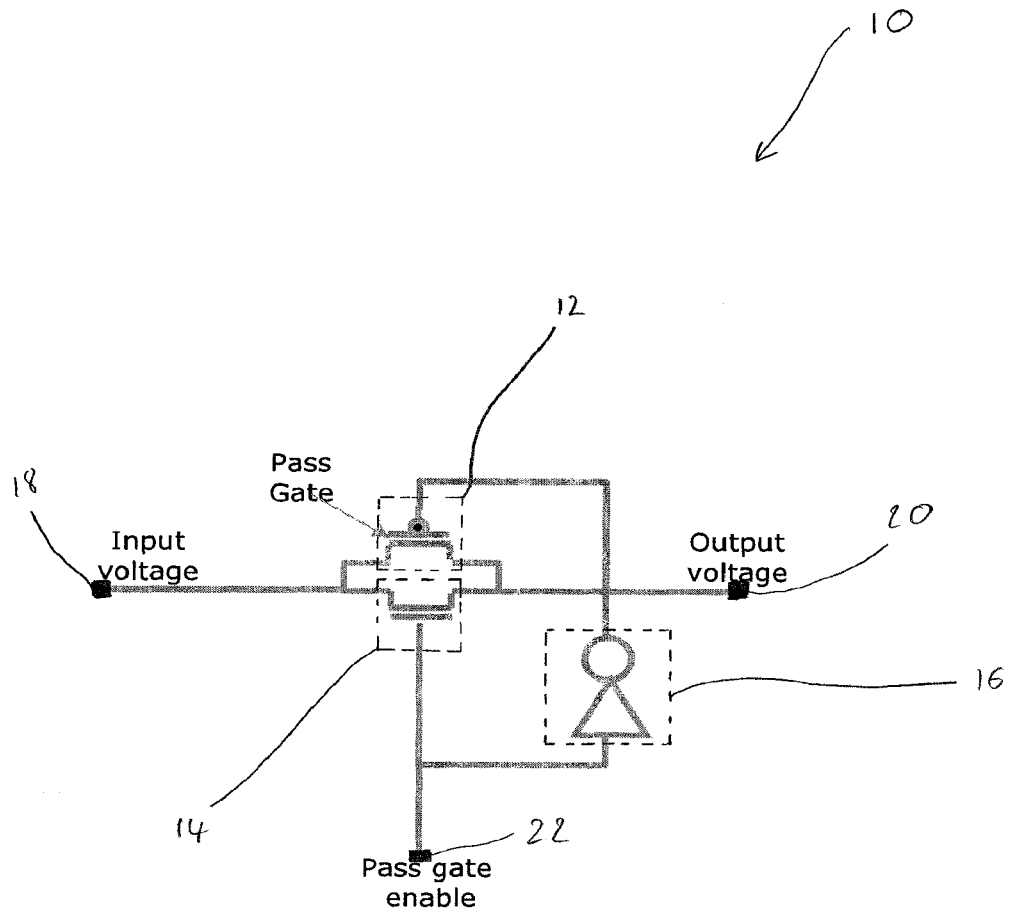
FIG. 4 shows an equivalent circuit of a conventional transmission gate.

FIG. 4 shows an equivalent circuit of a conventional transmission gate 10. The conventional transmission gate 10 includes a p-channel MOSFET 12, and a n-channel MOSFET 14, an inverter 16, an input terminal 18, an output terminal 20 and a control terminal 22 (MOSFET=Metal Oxide Semiconductor Field Effect Transistor). The p-channel MOSFET 12 and the n-channel MOSFET 14 are connected in parallel between the input terminal 18 and the output terminal 20. A gate contact of the n-channel MOSFET 14 is connected to the control terminal 22. A gate contact of the p-channel MOSFET 12 is connected to the control terminal 22 via the inverter 16. Hence, a voltage present at the gate contact of the n-channel MOSFET 14 is complementary to a voltage present at the gate contact of the p-channel MOSFET 12.

Depending on the voltage present at the control terminal 22 the transmission gate 10 has either a high or low impedance between the input terminal 18 and the output terminal 20. In the low-impedance state, the input terminal 18 and the output terminal 20 are connected and a current can flow through the transmission gate 10 in either direction. In the high-impedance state, the input terminal 18 and the output terminal 20 are electrically disconnected.

Figure 5:
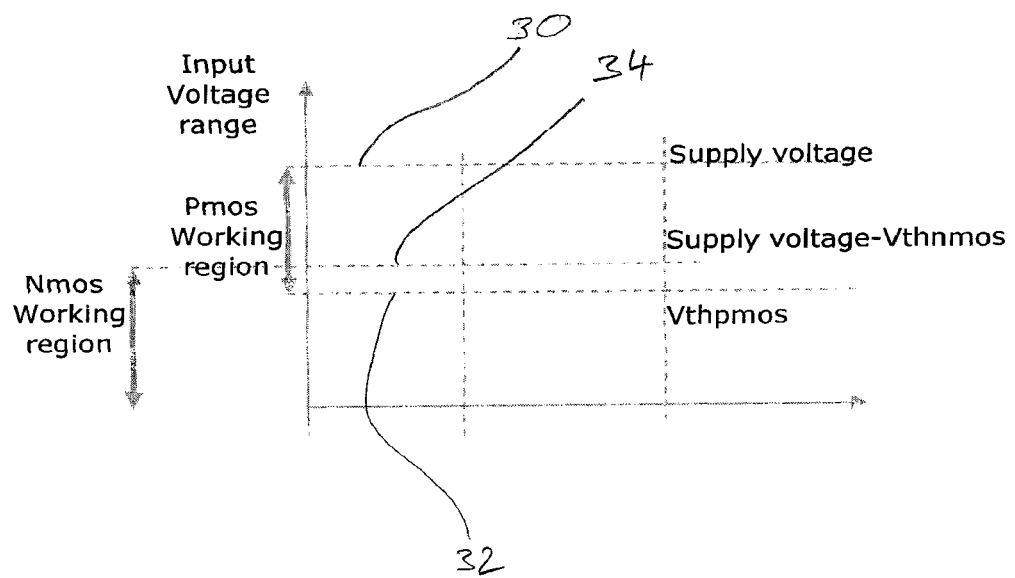
FIG. 5 shows a diagram of the input voltage functional range of the conventional transmission gate.

FIG. 5 shows a diagram of the input voltage functional range of the conventional transmission gate 10. The ordinate describes the input voltage range, or in other words, the range of the voltage present at the input terminal 18. The voltage present at the control terminal 22 is defined as the supply voltage 30.

The working region of the p-channel MOSFET 12 begins when the input voltage (Input_voltage) is equal to the threshold voltage 32 of the p-channel MOSFET 12 (Vthpmos), and the working region of the n-channel MOSFET 14 ends when the input voltage is equal to the difference 34 between the supply voltage 30 and the threshold voltage of the n-channel MOSFET 14 (Supply_voltage−Vthnmos). Hence, the conventional transmission gate 10 provides an input voltage functional range of:

$$V_{thpmos} < \text{Input\_voltage} < \text{Supply\_voltage} - V_{thnmos}. \quad (1)$$

This means that if:

$$V_{thpmos} < \text{Supply\_voltage} - V_{thnmos} \quad (2)$$

then the transmission gate 10 works for all input voltages.

Figure 6:
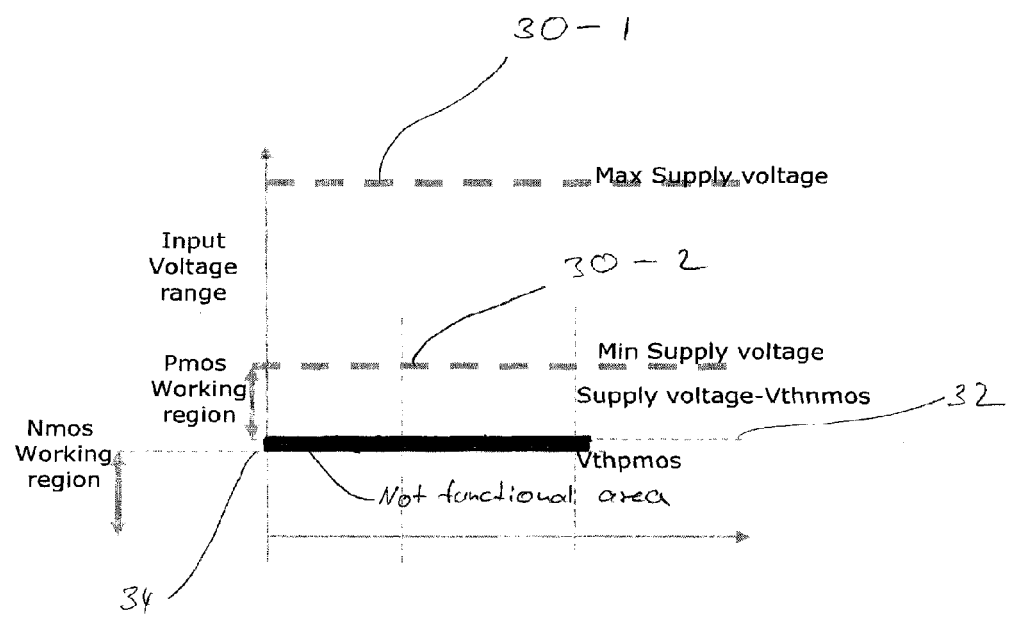
FIG. 6 shows a diagram of the input voltage functional range of the conventional transmission gate for a wide supply voltage range.

FIG. 6 shows a diagram of the input voltage functional range of the conventional transmission gate 10 for a wide supply voltage range. The ordinate describes the input voltage range, or in other words, the voltage present at the input terminal 18.

As in FIG. 4, the working region of the p-channel MOSFET 12 begins when the input voltage (Input_voltage) is equal to the threshold voltage 32 of the p-channel MOSFET 12 (Vthpmos), and the working region of the n-channel MOSFET 14 ends when the input voltage is equal to the difference 32 between the supply voltage 30 and the threshold voltage of the n-channel MOSFET 14 (Supply_voltage−Vthnmos).

Due to technology reasons and nowadays wide range of supply voltages for products working in different voltage classes it may happen that equation (2) is not satisfied. In other words, it may happen that the threshold voltage 32 of the p-channel MOSFET 12 (or the absolute value thereof) is greater than the difference 34 between the supply voltage 30 minus the threshold voltage of the n-channel MOSFET 14 (Vthpmos>Supply_voltage−Vthnmos). In this case, the functional range of the transmission gate 10 is characterized by (or interrupted by) a non functional area 34 as shown in FIG. 6.

For example, if the maximum supply voltage 30-2 amounts to 7 V and the minimum supply voltage 30-1 amounts to 1.6 V then the n-channel MOSFET 14 and the p-channel MOSFET 12 must have an oxide thickness typical for a medium voltage gate but might have to work in conditions typical for a low voltage gate. In this case, the conventional transmission gate 10 shown in FIG. 4 does not work over the entire input voltage range.

It has been found that the problem could be solved by using low threshold voltage (Vth) devices with special channel implants in order to not increase too much the threshold voltage from the unbiased level. Nevertheless, this requires special hardware and can therefore not be a general purpose solution.

Moreover, it has been found that the problem could be solved by using an active circuit, e.g. a charge pump, in order to boost the gate voltage of the n-channel MOSFET 14. A charge pump, however, requires a running clock and an on/off-regulator for regulating the charge pump, or even more complicated components. In addition, a charge pump consumes current, requires time to reach the correct voltage and needs a controlled on/off-sequence.

Furthermore, it has been found that the problem could be solved by using a bulk voltage control in order to take advantage from the bulk effect. Anyway, this is only an improvement that requires the capability of controlling the bulk voltage anyhow.

In contrast to the above mentioned reference solutions, embodiments described herein provide a transmission gate 100 with support for a wide supply voltage range without requiring special components or devices.

Figure 7:
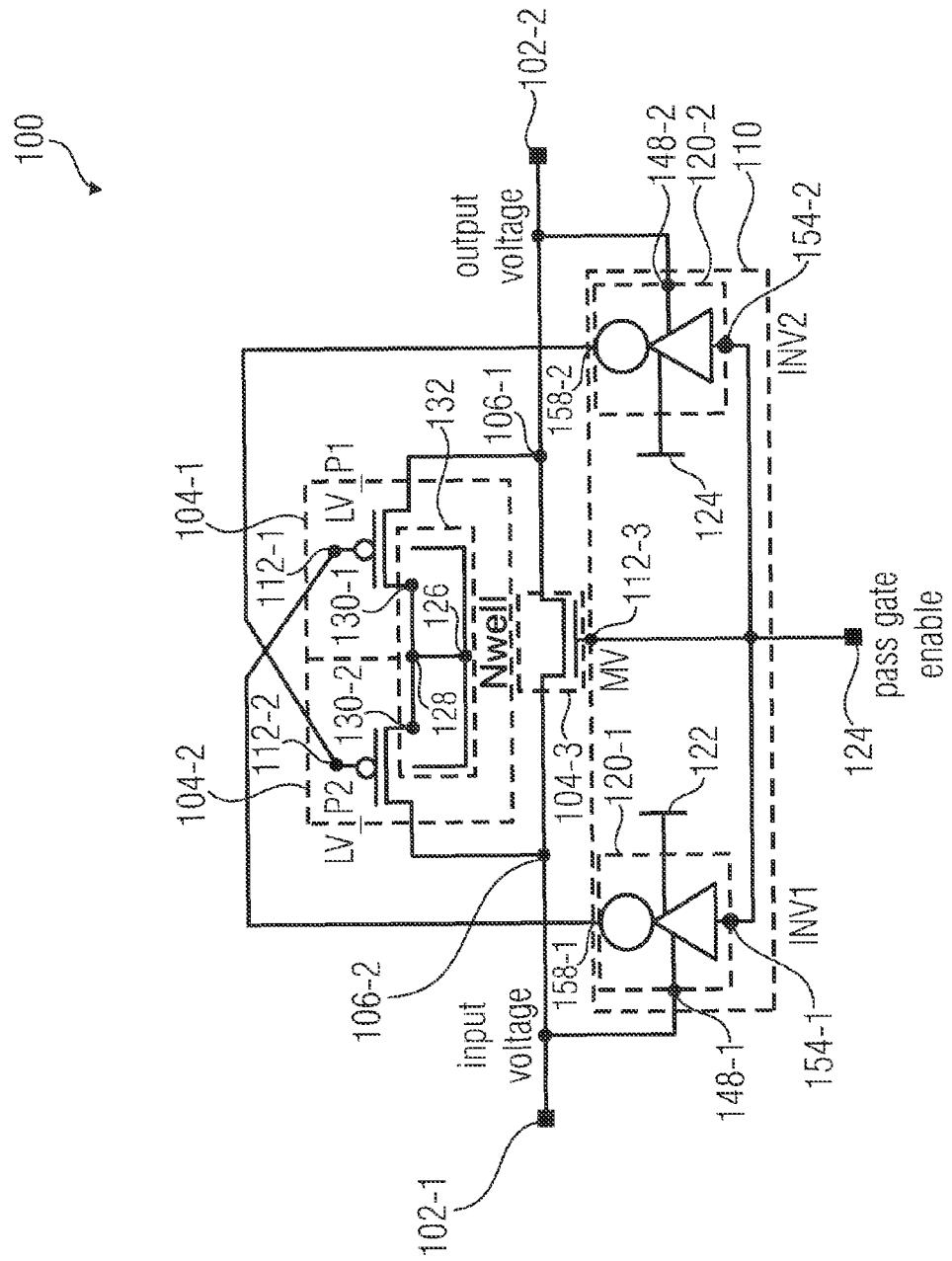
FIG. 7 shows an equivalent circuit of a transmission gate according to an embodiment.

FIG. 7 shows an equivalent circuit diagram of a transmission gate 100 according to an embodiment. The transmission gate 100 is similar to the transmission gate 100 shown in FIG. 1. Hence, in the following, only additional and/or different features are described.

The control circuit 110 includes a first inverter 120-1 and a second inverter 120-2. The first inverter 120-1 (or more precisely, a supply terminal thereof) is coupled to the first transmission path terminal 102-1, such that the first inverter 120-1 is supplied based on a voltage present at the first transmission path terminal 102-1. The second inverter 120-2 (or more precisely, a supply terminal thereof) is coupled to the second transmission path terminal 102-2, such that the second inverter 120-2 is supplied based on a voltage present at the second transmission path terminal 102-2. The first inverter 120-1 is configured to provide a control voltage for the gate contact 112-1 of the first field effect transistor 104-1, and the second inverter 120-2 is configured to provide a control voltage for the gate contact 112-2 of the second field effect transistor 104-2. For example, an output of the first inverter 120-1 may be coupled to the gate contact 112-1 of the first field effect transistor 104-1, and an output of the second inverter 120-2 may be coupled to the gate contact 112-2 of the second field effect transistor 104-1.

In addition, the first inverter 120-1 and the second inverter 120-2 (or more precisely, a supply terminal thereof) might be coupled to a ground terminal 122 of the transmission gate 100, such that the supply voltage of the first inverter 104-1 is defined as the voltage difference between the voltage present at the first transmission path terminal 102-1 and the voltage present at the ground terminal 122, and such that a supply voltage of the second inverter 104-2 is defined as a voltage difference between the voltage present at the second transmission path terminal 102-2 and the voltage present at the ground terminal 122.

Moreover, the first inverter 120-1 (or more precisely, an input of the first inverter 120-1) and the second inverter 120-2 (or more precisely, an input of the second inverter 120-2) might be coupled to a control terminal 124 of the transmission gate 100. The first inverter 120-1 might be configured to switch the control voltage for the gate contact of the first field effect transistor 104-1 between the voltage present at the first transmission path terminal 102-1 and the voltage present at the ground terminal 122, based on (or in dependence on) a voltage present at the control terminal 124. The second inverter 120-2 might be configured to switch the control voltage for the gate contact 112-2 of the second field effect transistor 104-2 between the voltage present at the second transmission path terminal 102-2 and the voltage present at the ground terminal 122 based on (or in dependence on) the voltage present at the control terminal 124.

In some embodiments, the first inverter 120-1 might be supplied by the voltage present at the first transmission path terminal 102-1 (input voltage) and the voltage present at the ground terminal 122 might be used as a negative supply voltage. In this way, a logic 0 at the output (of the first inverter 120-1) is defined as a voltage present at the ground terminal 122 and a logic 1 at the output is defined as a voltage present at the first transmission path terminal 102-1. The second inverter 120-2 might be supplied by the voltage present at the second transmission path terminal 102-2 (output voltage) and the voltage present at the ground terminal 122 is used as negative supply voltage. In this way, a logic 0 at the output (of the second inverter 120-2) is defined as a voltage present at the ground terminal 122 and a logic 1 at the output is defined as a voltage present at the second transmission path terminal 102-2.

Furthermore, in some embodiments, a bulk contact of at least one of the first field effect transistor 104-1 and the second field effect transistor 104-2 may optionally, but not necessarily, be connected to a node 128 that is electrically between the channel of the first field effect transistor 104-1 and the channel of the second field effect transistor 104-2.

Moreover, as shown in FIG. 7, a bulk contact of the first field effect transistors 104-1 and a bulk contact of the second field effect transistor 104-2, or a common bulk contact 126 of the first field effect transistors 104-1 and the second field effect transistor 104-2 may optionally, but not necessarily, be connected to a node 128 that is electrically between the channel of the first field effect transistor 104-1 and the channel of the second field effect transistor 104-2.

In some embodiments, a second channel contact 130-1 of the first field effect transistor 104-1 and a second channel contact 130-2 of the second field effect transistor 104-2 might be coupled directly to the node 128 that is electrically between the channel of the first field effect transistor 104-1 and the channel of the second field effect transistor 104-2.

The transmission gate 100 shown in FIG. 7 may optionally, but not necessarily, include a third field effect transistor 104-3 connected in parallel to the series connection of the first field effect transistor 104-1 and the second field effect transistor 104-2. A channel of the third field effect transistor 104-3 is coupled between the first transmission path terminal 102-2 and the second transmission path terminal 102-2.

In some embodiments, the third field effect transistor 104-3 is a field effect transistor complementary to the first field effect transistor 104-1 and to the second field effect transistor 104-2. In this case, the control circuit 110 might be configured to provide a control voltage for a gate contact 112-3 of the third field effect transistor 104-3 such that the control voltage for the gate contact 112-3 of the third field effect transistor 104-3 is complementary to the control voltage for the gate contact 112-1 of the first field effect transistor 104-1 and to the control voltage for the gate contact 112-2 of the second field effect transistor 104-2.

In some embodiments, the first field effect transistor 104-1 and the second field effect transistor 104-2 might be a p-channel MOSFET and the third field effect transistor 104-3 might be a n-channel MOSFET (MOSFET=Metal Oxide Semiconductor Field Effect Transistor). In addition, the first p-channel MOSFET 104-1 and the second p-channel MOSFET 104-2 might have an N-well, where the bulk contact 126 might be a contact of the N-well. Alternatively, the p-channel MOSFET 104-1 and the second p-channel MOSFET 104-2 might have a common N-well.

In the following description of the transmission gate 100 shown in FIG. 7, the first field effect transistor 104-1 and the second field effect transistor 104-2 are assumed to be p-channel MOSFETS and the third field effect transistor 104-3 is assumed to be a n-channel MOSFET.

Moreover, the two p-channel MOSFETS are preferably, but not necessarily, low voltage devices with an N-well 132 connected electrically to a inner P-diffusion. The technology used might be a p-type bulk.

Figure 8:
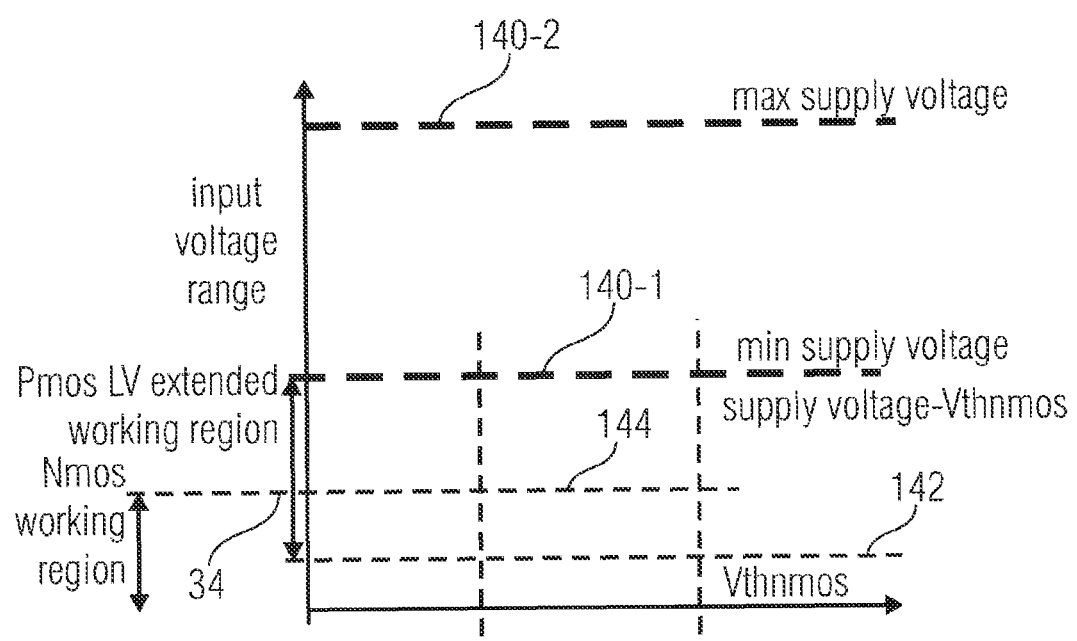
FIG. 8 shows a diagram of the input voltage functional range of the transmission gate shown in FIG. 7.

FIG. 8 shows a diagram of the input voltage functional range of the transmission gate 100 shown in FIG. 7. The ordinate describes the input voltage range, or in other words, the voltage present at the first transmission path terminal 102-1. The working region of the two pchannel MOSFETs 104-1 and 104-2 begins when the input voltage is equal to the threshold voltage 142 of the two p-channel MOSFETs 104-1 and 104-2 (Vthpmos), and the working region of the n-channel MOSFET 104-3 ends when the input voltage is equal to the difference 144 between the supply voltage and the threshold voltage (Supply_voltage−Vthnmos) of the nchannel MOSFET 104-3.

In some embodiments, the supply voltage or external voltage (the voltage present at the control terminal 124 of the transmission gate 100) is a high voltage, e.g. between 1 V and 7 V, or between 1 V and 12 V or even between 1.6 V and 700 V. Moreover, the voltage (input voltage) present at the first transmission path terminal 102-1 or the voltage (output voltage) present at the second transmission path terminal 102-2 might be a voltage of up to 600 mV. It has been found that with the lowering of the supply voltage it is more and more common to have analog voltages used for low voltage building blocks while the supply voltage (or control voltage) is a mid/high voltage.

The two p-channel MOSFETs 104-1 and 104-2 are preferably, but not necessarily, thin gate oxide devices (e.g. low threshold voltage devices). Hence, the two p-channel MOSFETs 104-1 and 104-2 comprise a lower threshold voltage (Vth), for example, compared to the conventional transmission gate 10 shown in FIG. 4, which extends the working region of the p-channel MOSFETs 104-1 and 104-2.

Moreover, the N-well 132 of the two p-channel MOSFETs 104-1 and 104-2 is, in the switch-on state, biased with the voltage present at the first and/or second transmission path terminal 102-1, 102-2 (input and/or output voltage). A bulk effect is reduced or even minimized which leads to a further reduction of the threshold voltage of the two p-channel MOSFETs 104-1 and 104-2 (Vthpmos), or in other words, to an extension of the working region of the two p-channel MOSFETs 104-1 and 104-2.

Figure 9:
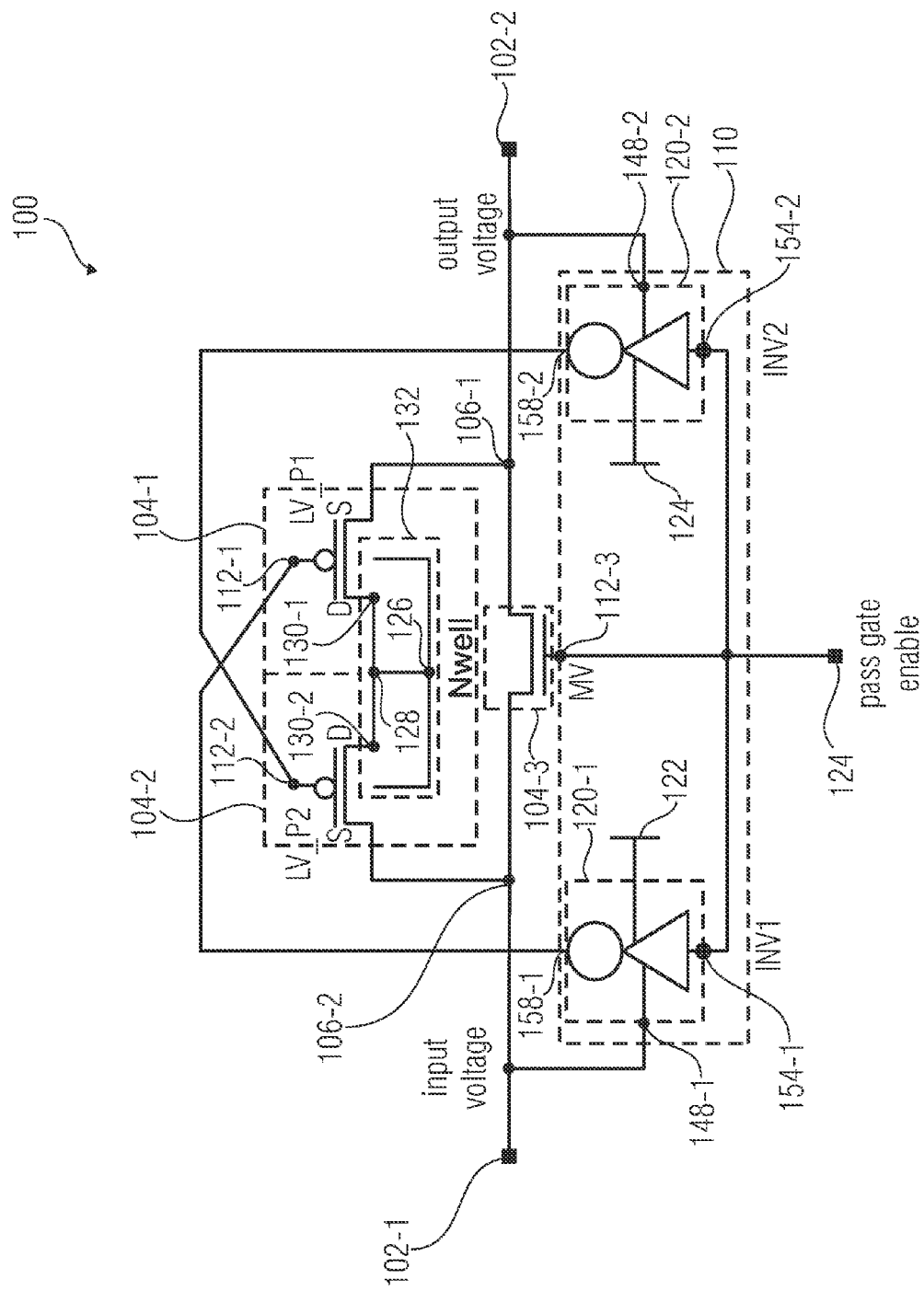
FIG. 9 shows the equivalent circuit of the transmission gate shown in FIG. 7 with defined drain and source contacts of the two p-channel MOSFETs.

FIG. 9 shows the equivalent circuit of the transmission gate 100 shown in FIG. 7 with defined drain contacts (D) and source contacts (S) of the two p-channel MOSFETs 104-1 and 104-2. The channel contacts 106-1 and 106-2 of the two p-channel MOFETS 104-1 and 104-2 are defined as source contacts (S), wherein the second channel contacts 130-1 and 130-2 are defined as drain contacts (D).

Figure 10:
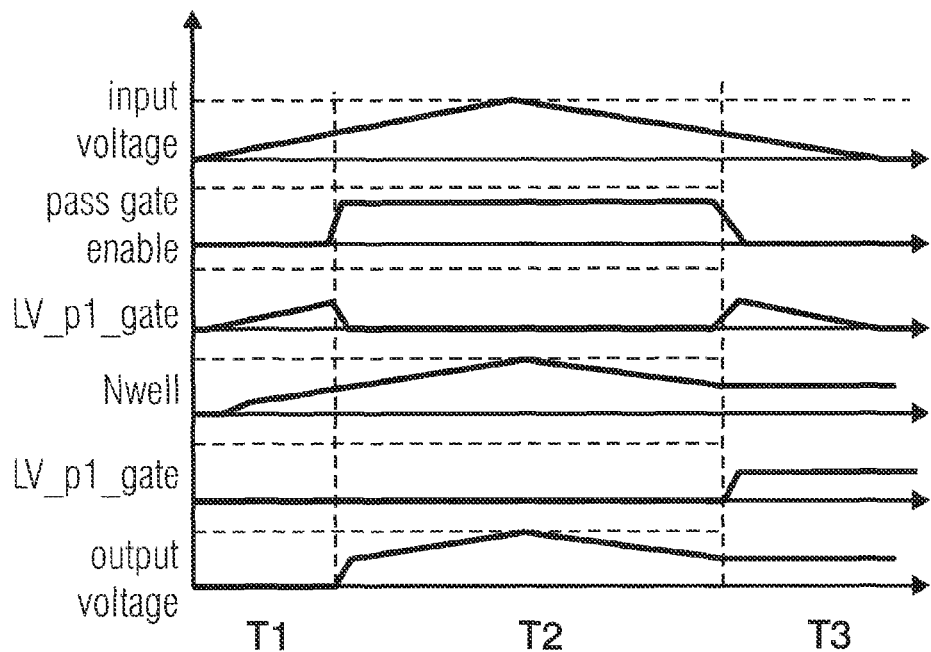
FIG. 10 shows a diagram of the voltage levels at the first transmission path terminal, the control terminal, the gate contact of the first p-channel MOSFET, the N-well, the gate contact of the second p-channel MOSFET and the second transmission path terminal.

FIG. 10 shows a diagram of the voltage levels at the first transmission path terminal 102-1, the control terminal 124, the gate contact 112-1 of the first p-channel MOSFET 104-1, the N-well 132, the gate contact 112-2 of the second p-channel MOSFET 104-2 and second transmission path terminal 102-2. The ordinate describes the voltage levels and the abscissa describes the time. Moreover, in FIG. 10, time is separated into three time intervals denoted with T1, T2, and T3. FIG. 10 shows the voltage levels of the transmission gate 100 in the switch-off state within the time intervals T1 and T2, and in the switch-on state within the time interval T2.

In the switch-on state of the transmission gate 100 (time interval T2) the first p-channel MOSFET 104-1 comprises a gate source voltage (Vgs) equal to the voltage present at the first transmission path terminal (input voltage), and the second p-channel MOSFET 104-2 includes a gate source voltage (Vgs) equal to the voltage present at the second transmission path terminal 102-2 (output voltage). In other words, if the voltage present at the first transmission path terminal 102-1 (input voltage) is greater than the threshold voltage of the first p-channel MOSFET 104-1 or the voltage present at the second transmission path terminal 102-2 (output voltage) is greater than the threshold voltage of the second p-channel MOSFET 104-2 then the transmission gate 100 is operative (switch-on state) with a minimum bulk effect and the N-well 132, the first transmission path terminal 102-1 (input) and the second transmission terminal 102-2 (output) are connected.

Moreover, for voltages lower than the threshold voltage of the two p-channel MOSFET 104-1 and 104-2 the functionality of the transmission gate 100 is guaranteed (at least in most situations) by the n-channel MOSFET 104-3.

In the switch-off state of the transmission gate 100, the gate source voltage (Vgs) of the first p-channel MOSFET 104-1 is equal to the voltage present at the first transmission path terminal 102-1 minus the voltage present at the second transmission path terminal 102-2 (Vgs=input_voltage−output_voltage), and the gate source voltage (Vgs) of the second p-channel MOSFET 104-2 is equal to the voltage present at the second transmission path terminal 102-2 minus the voltage present at the first transmission path terminal 102-1 (Vgs=output_voltage−input_voltage). This means that in any case at least one of the two p-channel MOSFETs 104-1 or 104-2 has a gate source voltage (Vgs) that is positive. If one of the two p-channel MOSFETs 104-1 or 104-2 is switched-on during the switch-off state of the transmission gate 100 due to a gate source voltage (Vgs) greater than its threshold voltage (Vgs>Vthpmos) then the N-well 132 is charged. Nevertheless, in any case, the second of the two p-channel MOSFETs 104-1 or 104-2 has a gate source voltage (Vgs) smaller than zero and thus will be switched-off.

In addition, in the switch-off state of the transmission gate 100, the N-well 132 will be biased by the PN-junction at the p-channel MOSFET source. If the voltage present at the first transmission path terminal 102-1 or the voltage present at the second transmission path terminal 102-2 is greater than the N-well voltage by the threshold voltage of the PN-junction (Vth_pn) then the forward PN-diode (e.g. at the p-channel MOSFET source) will charge the N-well 132.

If the voltage present at the first transmission path terminal 102-1 and/or the voltage present at the second transmission path terminal 102-2 is lower than the N-well voltage minus the threshold voltage of the PN-junction then the n-well 126 will be floating. In this case, a clamping element such as a Zener diode or serial diodes can be used to avoid damage or latch-up effects. Even a leaker circuit could be used to always bias the N-well 132.

In other words, as described above, embodiments described herein provide a transmission gate 100 with an interleaved self-supplied p-channel MOSFET (104-1 and 104-2) connection with a floating N-well 132 that makes possible in any case and at any voltage to close the transmission gate 100 (e.g. to bring the transmission gate 100 into the switch-off state or high impedance state) without the use of a low-voltage but only using the main supply voltage (voltage present at the control terminal 124) and to self bias the N-well 132 allowing the minimum bulk effect.

The transmission gate 100 according to the embodiments described herein uses the available technology, i.e. low voltage devices and bulk control, although the control voltage, or in other words, the voltage present at the control terminal 124, is a high voltage.

Moreover, some embodiments of the transmission gate 100 do not use bias voltages/currents and do not consume any power. However, embodiments that do not fulfill these criteria can also be designed.

Furthermore, the transmission gate 100 has a small complexity. The transmission gate 100 uses only an additional inverter compared to the conventional transmission gate 10 shown in FIG. 4 to implement the low voltage control using a high voltage, e.g. the external not regulated voltage, making the implementation also suitable for power-up block implementations. Since two low voltage p-channel MOSFETS 104-1 and 104-2 are used, the area required by the transmission gate 100 is comparable to the area required by the conventional transmission gate 10 shown in FIG. 4.

In addition, the transmission gate 100 according to the concept of the embodiments described herein can be used as a general purpose solution.

Figure 11:
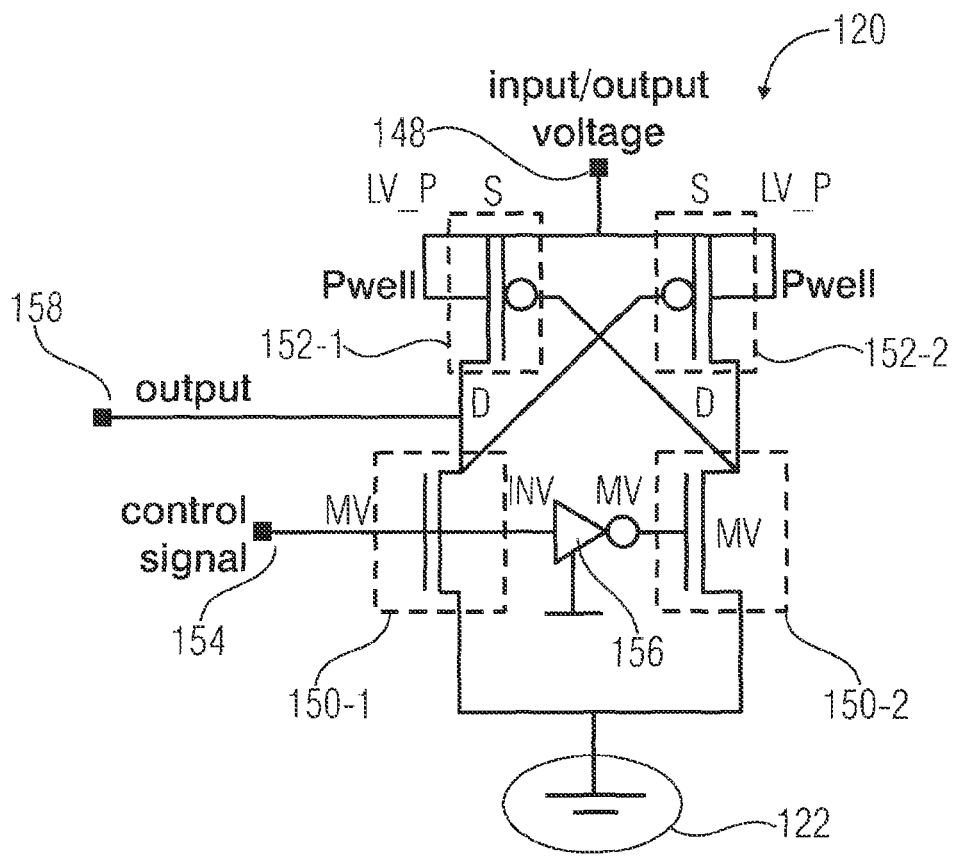
FIG. 11 shows an equivalent circuit of the first inverter and the second inverter shown in FIGS. 7 and 9 according to an embodiment.

FIG. 11 shows an equivalent circuit of a possible implementation of the first inverter 120-1 and the second inverter 120-2 shown in FIGS. 7 and 9 according to an embodiment. However, different implementations may be used. The inverter 120 shown in FIG. 11 is a level shifter that includes a first n-channel MOSFET 150-1, a second n-channel MOSFET 150-2, a first p-channel MOSFET 152-1, a second p-channel MOSFET 152-2, an inverter 156, a control terminal 154, an output terminal 158, a ground terminal 122 and a supply terminal 148.

The first n-channel MOSFET 150-1 and the first p-channel MOSFET 152-1 (or more precisely, the channels thereof) are connected in series between the supply terminal 148 and the ground terminal 122, such that a first channel contact of the first n-channel MOSFET 150-1 is coupled to the ground terminal 122 and a first channel contact of the first p-channel MOSFET 152-1 is coupled to the supply terminal 148.

The second n-channel MOSFET 150-2 and the second p-channel MOSFET 152-2 are connected in series between the supply terminal 148 and the ground terminal 122, such that a first channel contact of the second n-channel MOSFET 150-2 is coupled to the ground terminal 122 and a first channel contact of the second p-channel MOSFET 152-2 is coupled to the supply terminal 148.

A gate contact of the first n-channel MOSFET 150-1 is coupled to the control terminal 154, and the gate contact of the second n-channel MOSFET 150-2 is coupled to the control terminal 154 via the inverter 156. Hence, the voltage present at the gate contact of the first n-channel MOSFET 150-1 is complementary to the voltage present at the gate contact of the second n-channel MOSFET 150-2.

A gate contact of the first p-channel MOSFET 152-1 is supplied based on a voltage present at a node that is electrically between the second channel contact of the second n-channel MOSFET 150-2 and the second channel contact of the second p-channel MOSFET 152-2. Or more precisely, the gate contact of the first p-channel MOSFET 152-1 is supplied based on a voltage present at the second channel contact of the second n-channel MOSFET 150-2 or the second p-channel MOSFET 152-2.

A gate contact of the second p-channel MOSFET 152-2 is supplied based on a voltage present at a node that is electrically between the second channel contact of the first n-channel MOSFET 150-1 and the second channel contact of the first p-channel MOSFET 152-2. Or more precisely, the gate contact of the second p-channel MOSFET 152-2 is supplied based on a voltage present at the second channel contact of the first n-channel MOSFET 150-1 or the first p-channel MOSFET 152-1.

Moreover, the output terminal 158 is coupled to the node that is electrically between the second channel contact of the first n-channel MOSFET 150-1 and the second channel contact of the first p-channel MOSFET 150-2.

In addition, the output terminal 158 may be coupled to the gate contact 112-1 of the first field effect transistor 104-1 or to the gate contact 112-2 of the second field effect transistor 104-2 e.g. as shown in FIG. 5. The supply terminal 148 might be coupled to the first transmission path terminal 102-1 or to the second transmission path terminal 102-2 e.g. as shown in FIG. 7.

The two n-channel MOSFETs 150-1 and 150-2 and the inverter 156 are medium voltage devices, i.e. they can be controlled and supplied directly by the external voltage (the voltage present at the control terminal 124 of the transmission gate 100). The two p-channel MOSFETs 152-1 and 152-2 are low voltage devices and may be operative as soon as the voltage present at the supply terminal 148 (input/output voltage) is greater than the threshold voltage of the two p-channel MOSFETs 152-1 and 152-2 (input/output_voltage>Vthpmos_lowvoltage).

A logical 0 at the output terminal 158 is guaranteed in any condition and a logical 1 at the output terminal 158 is only available when the input and/or output voltage present at the supply terminal 148 is greater than the threshold voltage of the p-channel MOSFETs 152-1 and 152-2 (input/output_voltage>Vthpmos_lowvoltage). In all other conditions, the level shifter 120 does not consume any power due to the fact that the input and/or output voltage present at the supply terminal 148 is smaller than the threshold voltage of the two p-channel MOSFETs 152-1 and 152-2 (input/output_voltage<Vthpmos_lowvoltage) and hence no current flows into the level shifter 120.

Further embodiments provide means for establishing a transmission path which includes: a first means for contacting the transmission path and a second means for contacting the transmission path; a series connection of a first means for switching and a second means for switching, wherein a switched path of the first means for switching and a switched path of the second means for switching are coupled in series between the first means for contacting the transmission path and the second means for contacting the transmission path, such that the switch path of the first means for switching is coupled to the second means for contacting the transmission path and the switched path of the second means for switching is coupled to the first means for contacting the transmission path; and a means for providing a control voltage to control the first means for switching and a control voltage to control the second means for switching, wherein the control voltage for the control of the first means for switching is, in a switch-off state of the means for establishing a transmission path, based on a voltage present at the second means for contacting the transmission path, and wherein the control voltage for the control of the second means for switching is, in the switch-off state of the means for establishing a transmission path, based on a voltage present at the first means for contacting the transmission path.

Furthermore, embodiments provide a method for controlling a transmission gate for selectively establishing a transmission path. The transmission gate includes a first transmission path terminal, a second transmission path terminal and a series connection of a first field effect transistor and a second field effect transistor. A channel of the first field effect transistor and a channel of the second field effect transistor are coupled in series between the first transmission path terminal and the second transmission path terminal such that a channel contact of the first field effect transistor is coupled to the second transmission path terminal and a channel contact of the second field effect transistor is coupled to the first transmission path terminal. The method for controlling a transmission gate for selectively establishing a transmission path comprises the step of providing a control voltage for the gate contact of the first field effect transistor and a control voltage for a gate contact of the second field effect transistor. The control voltage for the gate contact of the first field effect transistor is, in a switch-off state of the transmission gate, provided based on a voltage present at the first transmission path terminal, and wherein the control voltage for the gate contact of the second field effect transistor is, in the switch-off state of the transmission gate, provided based on a voltage present at the second transmission path terminal.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transmission gate for selectively establishing a transmission path, the transmission gate comprising:
    a first transmission path terminal and a second transmission path terminal;
    a series connection of a first field effect transistor and a second field effect transistor, wherein a channel of the first field effect transistor and a channel of the second field effect transistor are coupled in series between the first transmission path terminal and the second transmission path terminal, such that a channel contact of the first field effect transistor is coupled to the second transmission path terminal and a channel contact of the second field effect transistor is coupled to the first transmission path terminal; and
    a control circuit configured to provide a control voltage for a gate contact of the first field effect transistor and a control voltage for a gate contact of the second field effect transistor, such that the control voltage for the gate contact of the first field effect transistor is, in a switch-off state of the transmission gate, based on a voltage present at the first transmission path terminal, and such that the control voltage for the gate contact of the second field effect transistor is, in the switch-off state of the transmission gate, based on a voltage present at the second transmission path terminal, and such that the control voltage for the gate contact of the first field effect transistor and for the gate contact of the second field effect transistor is, in a switch-on state of the transmission gate, based on a voltage present at a ground terminal of the transmission gate,
    wherein the control circuit is configured to switch the control voltage for the gate contact of the first field effect transistor between the voltage present at the first transmission path terminal and the voltage present at the ground terminal, based on a voltage present at a control terminal of the transmission gate, and to switch the control voltage for the gate contact of the second field effect transistor between the voltage present at the second transmission path terminal and the voltage present at the ground terminal, based on the voltage present at the control terminal of the transmission gate.

2. The transmission gate according to claim 1, wherein the control circuit comprises a first inverter and a second inverter, wherein the first inverter is coupled to the first transmission path terminal, such that the first inverter is supplied based on a voltage present at the first transmission path terminal, and wherein the second inverter is coupled to the second transmission path terminal, such that the second inverter is supplied based on a voltage present at the second transmission path terminal, wherein the first inverter is configured to provide a control voltage for the gate contact of the first field effect transistor, and wherein the second inverter is configured to provide a control voltage for the gate contact of the second field effect transistor.

3. The transmission gate according to claim 2, wherein the first inverter and the second inverter of the control circuit are further coupled to a ground terminal of the transmission gate, such that a supply voltage of the first inverter is defined as a voltage difference between the voltage present at the first transmission path terminal and the voltage present at the ground terminal, and such that a supply voltage of the second inverter is defined as a voltage difference between the voltage present at the second transmission path terminal and the voltage present at the ground terminal.

4. The transmission gate according to claim 2, wherein the first inverter and the second inverter of the control circuit are coupled to a control terminal of the transmission gate, such that the first inverter switches the control voltage for the gate contact of the first field effect transistor between the voltage present at the first transmission path terminal and the voltage present at the ground terminal, based on a voltage present at the control terminal, and such that the second inverter switches the control voltage for the gate contact of the second field effect transistor between the voltage present at the second transmission path terminal and the voltage present at the ground terminal, based on the voltage present at the control terminal.

5. The transmission gate according to claim 1, wherein a bulk contact of at least one of the first field effect transistor and the second field effect transistor is connected to a node that is electrically between the channel of the first field effect transistor and the channel of the second field effect transistor.

6. The transmission gate according to claim 1, wherein a bulk contact of the first field effect transistor and a bulk contact of the second field effect transistor are connected to a node that is electrically between the channel of the first field effect transistor and the channel of the second field effect transistor.

7. The transmission gate according to claim 1, further comprising a third field effect transistor connected in parallel to the series connection of the first field effect transistor and the second field effect transistor, wherein a channel of the third field effect transistor is coupled between the first transmission path terminal and the second transmission path terminal.

8. The transmission gate according to claim 6, wherein the third field effect transistor is a field effect transistor complementary to the first field effect transistor and to the second field effect transistor, and wherein the control circuit is configured to provide a control voltage for a gate contact of the third field effect transistor, such that the control voltage for the gate contact of the third field effect transistor is complementary to the control voltage of the gate contact of the first field effect transistor and to the control voltage of the gate contact of the second field effect transistor.

9. A transmission gate for selectively establishing a transmission path, comprising:
 a first transmission path terminal and a second transmission path terminal;
 a series connection of a first field effect transistor and a second field effect transistor, wherein a channel of the first field effect transistor and a channel of the second field effect transistor are coupled in series between the first transmission path terminal and the second transmission path terminal, such that a channel contact of the first field effect transistor is coupled to the second transmission path terminal and a channel contact of the second field effect transistor is coupled to the first transmission path terminal; and
 a control circuit configured to provide a control voltage for a gate contact of the first field effect transistor and a control voltage for a gate contact of the second field effect transistor, such that the control voltage for the gate contact of the first field effect transistor is, in a switch-off state of the transmission gate, based on a voltage present at the first transmission path terminal, and such that the control voltage for the gate contact of the second field effect transistor is, in the switch-off state of the transmission gate, based on a voltage present at the second transmission path terminal, and such that the control voltage for the gate contact of the first field effect transistor and for the gate contact of the second field effect transistor is, in a switch-on state of the transmission gate, based on a voltage present at a ground terminal of the transmission gate,
 wherein the control circuit is configured to switch the control voltage for the gate contact of the first field effect transistor between the voltage present at the first transmission path terminal and the voltage present at the ground terminal, based on a voltage present at a control terminal of the transmission gate, and to switch the control voltage for the gate contact of the second field effect transistor between the voltage present at the second transmission path terminal and the voltage present at the ground terminal, based on the voltage present at the control terminal of the transmission gate; and
 wherein a bulk contact of at least one of the first field effect transistor and the second field effect transistor is connected to the node that is electrically between the channel of the first field effect transistor and the channel of the second field effect transistor.

10. The transmission gate according to claim 9, wherein a bulk contact of the first field effect transistor and a bulk contact of the second field effect transistor are connected to the node that is electrically between the channel of the first field effect transistor and the channel of the second field effect transistor.

11. The transmission gate according to claim 9, further comprising a third field effect transistor connected in parallel to the series connection of the first field effect transistor and the second field effect transistor, wherein a channel of the third field effect transistor is coupled between the first transmission path terminal and the second transmission path terminal.

12. The transmission gate according to claim 11, wherein the third field effect transistor is a field effect transistor complementary to the first field effect transistor and to the second field effect transistor, and wherein the control circuit is configured to provide a control voltage for a gate contact of the third field effect transistor, such that the control voltage for the gate contact of the third field effect transistor is complementary to the control voltage of the gate contact of the first field effect transistor and to the control voltage of the gate contact of the second field effect transistor.

13. A transmission gate for selectively establishing a transmission path, the transmission gate comprising:
 a first transmission path terminal and a second transmission path terminal;
 a series connection of a first field effect transistor and a second field effect transistor, wherein a channel of the first field effect transistor and a channel of the second field effect transistor are coupled in series between the first transmission path terminal and the second transmission path terminal, such that a channel contact of the first field effect transistor is coupled to the second transmission path terminal and a channel contact of the second field effect transistor is coupled to the first transmission path terminal, wherein a bulk contact of the first field effect transistor and a bulk contact of the second field effect transistor are connected to a node that is electrically between the channel of the first field effect transistor and the channel of the second field effect transistor;

a third field effect transistor connected in parallel to the series connection of the first field effect transistor and the second field effect transistor, wherein a channel of the third field effect transistor is coupled between the first transmission path terminal and the second transmission path terminal, wherein the third field effect transistor is a field effect transistor complementary to the first field effect transistor and to the second field effect transistor; and a first inverter and a second inverter, wherein the first inverter is coupled to the first transmission path terminal, such that the first inverter is supplied based on a voltage present at the first transmission path terminal, and wherein the second inverter is coupled to the second transmission path terminal, such that the second inverter is supplied based on a voltage present at the second transmission path terminal, wherein the first inverter is configured to provide a control voltage for a gate contact of the first field effect transistor, and wherein the second inverter is configured to provide a control voltage for a gate contact of the second field effect transistor.

14. The transmission gate according to claim 13, wherein the first inverter and the second inverter are further coupled to a ground terminal of the transmission gate, such that a supply voltage of the first inverter is defined as a voltage difference between the voltage present at the first transmission path terminal and the voltage present at the ground terminal, and such that a supply voltage of the second inverter is defined as a voltage difference between the voltage present at the second transmission path terminal and the voltage present at the ground terminal.

15. The transmission gate according to claim 14, wherein the first inverter and the second inverter of the control circuit are coupled to a control terminal of the transmission gate, such that the first inverter switches the control voltage for the gate contact of the first field effect transistor between the voltage present at the first transmission path terminal and the voltage present at the ground terminal, based on a voltage present at the control terminal, and such that the second inverter switches the control voltage for the gate contact of the second field effect transistor between the voltage present at the second transmission path terminal and the voltage present at the ground terminal, based on the voltage present at the control terminal.

16. The transmission gate according to claim 15, wherein a gate contact of the third field effect transistor is coupled to the control terminal, such that a control voltage for the gate contact of the third field effect transistor is complementary to the control voltage of the gate contact of the first field effect transistor and to the control voltage of the gate contact of the second field effect transistor.

17. A transmission gate for establishing a transmission path, comprising:

a first means for contacting the transmission path;

a second means for contacting the transmission path;

a series connection of a first means for switching and a second means for switching, wherein a switched path of the first means for switching and a switched path of the second means for switching are coupled in series between the first means for contacting the transmission path and the second means for contacting the transmission path, such that the switch path of the first means for switching is coupled to the second means for contacting the transmission path and the switched path of the second means for switching is coupled to the first means for contacting the transmission path; and a means for providing a control voltage to control the first means for switching and a control voltage to control the second means for switching, wherein the control voltage for the control of the first means for switching is, in a switch-off state of the means for establishing a transmission path, based on a voltage present at the second means for contacting the transmission path, and wherein the control voltage for the control of the second means for switching is, in the switch-off state of the means for establishing a transmission path, based on a voltage present at the first means for contacting the transmission path;

wherein the means for providing the control voltage is configured to provide the control voltage for the control of the first means for switching and the control voltage for the control of the second means for switching, in a switch-on state of the means for establishing a transmission path, based on a voltage present at a ground terminal of the means for establishing a transmission path, and to switch the control voltage for the control of the first means for switching between the voltage present at the second means for contacting the transmission path and the voltage present at a means for grounding the means for establishing a transmission path, based on a voltage present at a means for controlling the means for establishing a transmission path, and to switch the control voltage for the control of the second means for switching between the voltage present at the second means for contacting the transmission path and the voltage present at the means for grounding the means for establishing a transmission path, based on the voltage present at the means for controlling the means for establishing a transmission path.

18. A method for controlling a transmission gate for selectively establishing a transmission path, wherein the transmission gate includes a first transmission path terminal, a second transmission path terminal and a series connection of a first field effect transistor and a second field effect transistor, wherein a channel of the first field effect transistor and a channel of the second field effect transistor are coupled in series between the first transmission path terminal and the second transmission path terminal such that a channel contact of the first field effect transistor is coupled to the second transmission path terminal and a channel contact of the second field effect transistor is coupled to the first transmission path terminal, the method comprising:

providing a control voltage for a gate contact of the first field effect transistor so that the control voltage for the gate contact of the first field effect transistor is, in a switch-off state of the transmission gate, provided based on a voltage present at the first transmission path terminal; and providing a control voltage for a gate contact of the second field effect transistor so that the control voltage for the gate contact of the second field effect transistor is, in the switch-off state of the transmission gate, provided based on a voltage present at the second transmission path terminal;

providing a control voltage for a gate contact of the second field effect transistor so that the control voltage for the gate contact of the second field effect transistor is, in the switch-off state of the transmission gate, provided based on a voltage present at the second transmission path terminal; and switching the control voltage for the gate contact of the first field effect transistor between the voltage present at the first transmission path terminal and the voltage present at the ground terminal, based on a voltage present at a control terminal of the transmission gate, and switching the control voltage for the gate contact of the second field effect transistor between the voltage present at the second transmission path terminal and the voltage present at the ground terminal, based on the voltage present at the control terminal of the transmission gate.

19. A transmission gate for selectively establishing a transmission path, the transmission gate comprising:

a first transmission path terminal and a second transmission path terminal;

a series connection of a first field effect transistor and a second field effect transistor, wherein a channel of the first field effect transistor and a channel of the second field effect transistor are coupled in series between the first transmission path terminal and the second transmission path terminal, such that a channel contact of the first field effect transistor is coupled to the second transmission path terminal and a channel contact of the second field effect transistor is coupled to the first transmission path terminal; and a control circuit configured to provide a control voltage for a gate contact of the first field effect transistor and a control voltage for a gate contact of the second field effect transistor, such that the control voltage for the gate contact of the first field effect transistor is, in a switch-off state of the transmission gate, based on a voltage present at the first transmission path terminal, and such that the control voltage for the gate contact of the second field effect transistor is, in the switch-off state of the transmission gate, based on a voltage present at the second transmission path terminal, wherein the control circuit comprises a first inverter and a second inverter, wherein the first inverter is coupled to the first transmission path terminal, such that the first inverter is supplied based on a voltage present at the first transmission path terminal, wherein the second inverter is coupled to the second transmission path terminal, such that the second inverter is supplied based on a voltage present at the second transmission path terminal, and wherein the first inverter is configured to provide a control voltage for the gate contact of the first field effect transistor, and wherein the second inverter is configured to provide a control voltage for the gate contact of the second field effect transistor.

* * * * *